United States Patent [19]

Fattaruso et al.

[11] Patent Number: 5,248,974
[45] Date of Patent: Sep. 28, 1993

[54] DIELECTRIC RELAXATION CORRECTION CIRCUIT FOR CHARGE-REDISTRIBUTION A/D CONVERTERS

[75] Inventors: John W. Fattaruso, Dallas; Khen-Sang Tan, Plano, both of Tex.

[73] Assignee: Texas Instruments Incorporated, Dallas, Tex.

[21] Appl. No.: 722,731

[22] Filed: Jun. 27, 1991

[51] Int. Cl.⁵ .................. H03M 1/38; H03M 1/06
[52] U.S. Cl. .................... 341/172; 341/118; 341/122
[58] Field of Search ............ 341/172, 118, 122-125

[56] References Cited

U.S. PATENT DOCUMENTS

| | | | |
|---|---|---|---|
| 4,574,250 | 3/1986 | Senderowicz | 341/172 X |
| 4,764,753 | 8/1988 | Yukawa | 341/172 X |
| 4,791,405 | 12/1988 | Rybicki et al. | 341/172 X |
| 4,803,462 | 2/1989 | Hester et al. | 341/172 |
| 4,812,817 | 3/1989 | Bernard | 341/172 |
| 4,851,846 | 7/1989 | Haulin | 341/172 |
| 4,922,252 | 5/1990 | Draxelmayr et al. | 341/172 |
| 4,999,633 | 3/1991 | Draxelmayr | 341/172 X |

*Primary Examiner*—Sharon D. Logan
*Attorney, Agent, or Firm*—Rebecca A. Mapstone; James C. Kesterson; Richard L. Donaldson

[57] ABSTRACT

This dielectric relaxation correction circuit for charge-redistribution A/D converters, which has a comparator 20 and operates in a sample, hold and conversion mode, comprises: a capacitor array 22, a replica capacitance 35, having a bottom plate, arranged so as to be subject to the same sequence of charging voltages that the array capacitors 22 experience but in a neutralizing manner such that an error in the capacitor array 22 voltage is neutralized by the same error in the replica capacitance 35, and; a sample and hold circuit (S/H) 36 for sampling an input signal voltage during the sample mode, wherein the sample and hold 36 is arranged to hold the bottom plate of the replica capacitance 35 at the input signal voltage. Other devices, systems and methods are also disclosed.

18 Claims, 4 Drawing Sheets

5,248,974

DIELECTRIC RELAXATION CORRECTION CIRCUIT FOR CHARGE-REDISTRIBUTION A/D CONVERTERS

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to a dielectric relaxation correction circuit for charge-redistribution A/D converters.

BACKGROUND OF THE INVENTION

For the realization of a fast, successive-approximation A/D converter in MOS technology, conventional voltage driven R-2R techniques are cumbersome since diffused resistors of proper sheet resistance are not available in the standard single-channel technology. A complex thin-film process must be used. Furthermore, these approaches require careful control of the "ON" resistance ratios in the MOS switches over a wide range of values.

In contrast to its utilization as a current switch, the MOS device, used as a charge switch, has inherently zero offset voltage and as an amplifier, has very high input resistance. In addition, capacitors are easily fabricated in metal gate technology. Therefore, one is lead to use capacitors rather than resistors as the precision components, and to use charge rather than current as the working medium. This technique, referred to as charge-redistribution, has been used in some discrete A/D converters for many years. However, these converters have required high-performance operational amplifiers which are difficult to realize in single-channel MOS technology.

A charge redistribution A/D conversion technique using binary weighted capacitors is illustrated with a 5-bit version of the converter shown in FIG. 1. It consists of a comparator 20, an array of binary weighted capacitors 22, plus one additional capacitor of weight corresponding to the least significant bit (LSB) 24, and switches 30, 34 which connect the plates to certain voltages. A conversion is accomplished by a sequence of three operations. In the first, the "sample mode" shown in FIG. 1, the top plate 26 is connected to a reset potential Vr, and the bottom plates 28 are connected to the input voltage, Vin. This results in a stored charge on the top plate 26 which is proportional to the difference between the input voltage, Vin and the reset potential, Vr. In the "hold mode" of FIG. 2, the top switch 30 is then opened, and the bottom plates 28 are connected to ground through switches 34. Since the charge on the top plate is conserved, its potential goes to (Vr−Vin). The "redistribution mode", shown in FIG. 3, consists of switching the bottom plate voltage of one capacitor at a time from ground to Vref, beginning with the most significant bit (MSB) i.e. the largest capacitor. The switching tests the value of the most significant bit (MSB). The equivalent circuit is now actually a voltage divider between two equal capacitances, due to the sequential binary weighting of the capacitances in the array. The voltage Vx, which was equal to (Vr−Vin) previously, is now increased by ½ the reference as a result of this operation.

$$V_x = V_r - V_{in} + V_{ref}/2$$

Sensing the sign of Vx, the comparator output is a logic '1' if Vx<0 and is a '0' if Vx>0. This is analogous to the interpretation that $$\text{if } V_x < 0 \text{ then } (V_r - V_{in}) > V_{ref}/2;$$

hence the MSB=1; but $$\text{if } V_x > 0 \text{ then } (V_r - V_{in}) < V_{ref}/2;$$

therefore the MSB=0. The output of the comparator is, therefore, the value of the binary bit being tested. Switch S1 is returned to ground only if the MSB b4 is a zero. In a similar manner, the next MSB is determined by raising the bottom plate of the next largest capacitor to Vref and checking the polarity of the resulting value of Vx. In this case, however, the voltage division property of the array causes Vref/4 to be added to Vx:

$$V_x = V_r - V_{in} + b_4(V_{ref}/2) + b_2(V_{ref}/4).$$

Conversion proceeds in this manner until all the bits have been determined. A final configuration is illustrated in FIG. 4 for the digital output 01001. The total original charge on the top plates has been redistributed in a binary fashion. N redistributions are required for a conversion of N bits.

SUMMARY OF THE INVENTION

This dielectric relaxation correction circuit for charge-redistribution A/D converters, which has a comparator and operates in a sample, hold and conversion mode, comprises: a capacitor array, a replica capacitance, having a bottom plate, arranged so as to be subject to the same sequence of charging voltages that the array capacitors experience but in a neutralizing manner such that an error in the capacitor array voltage is neutralized by the same error in the replica capacitance, and; a sample and hold circuit (S/H) for sampling an input signal voltage during the sample mode, wherein the sample and hold is arranged to hold the bottom plate of the replica capacitance at the input signal voltage.

An advantage offered by this invention is the removal or the reduction of the conversion error incurred by dielectric relaxation of the capacitors in a charge redistribution A/D converter circuit.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
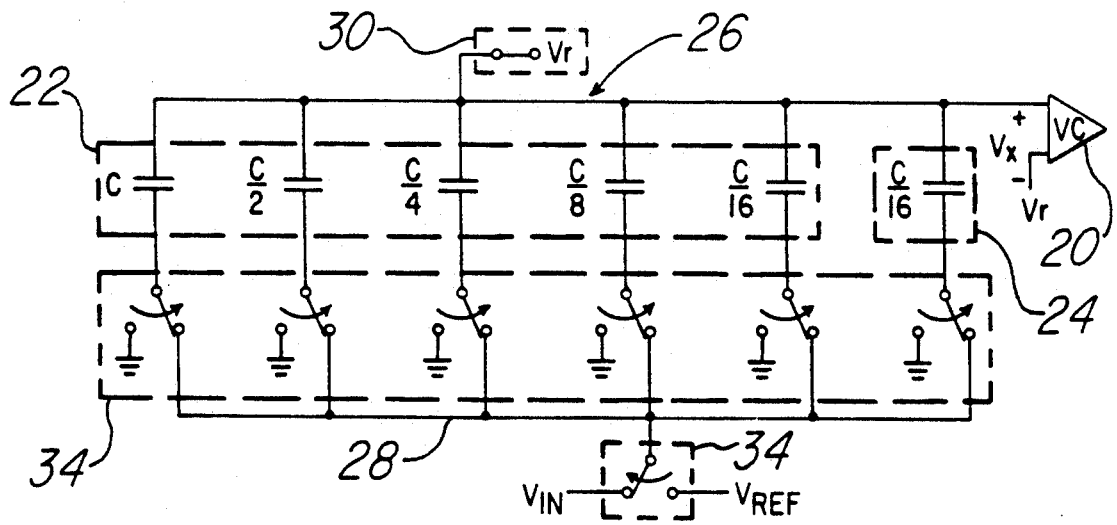
FIG. 1 is a schematic diagram of a charge-redistribution A/D converter in the sample mode of operation.
Figure 2:
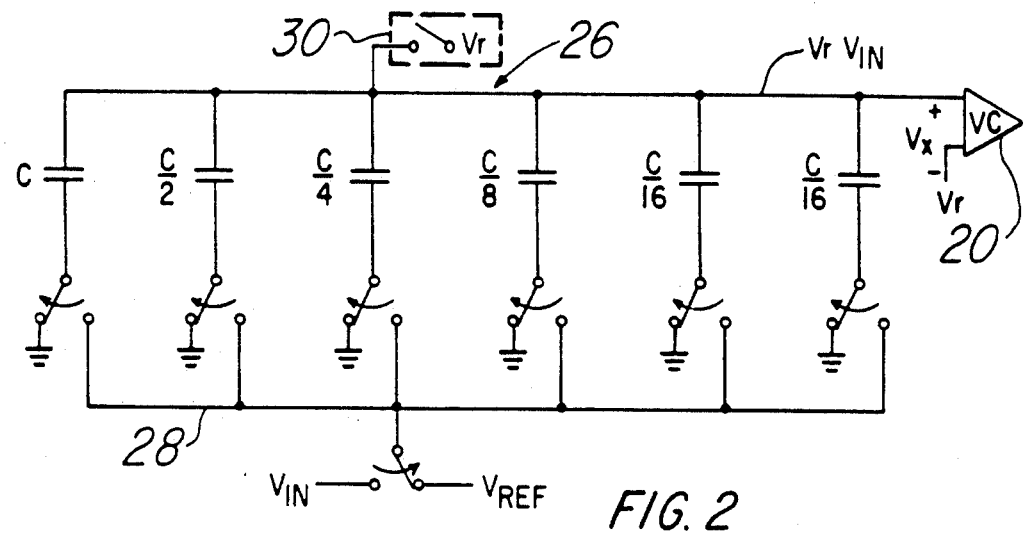
FIG. 2 is a schematic diagram of a charge-redistribution A/D converter in the hold mode of operation.
Figure 3:
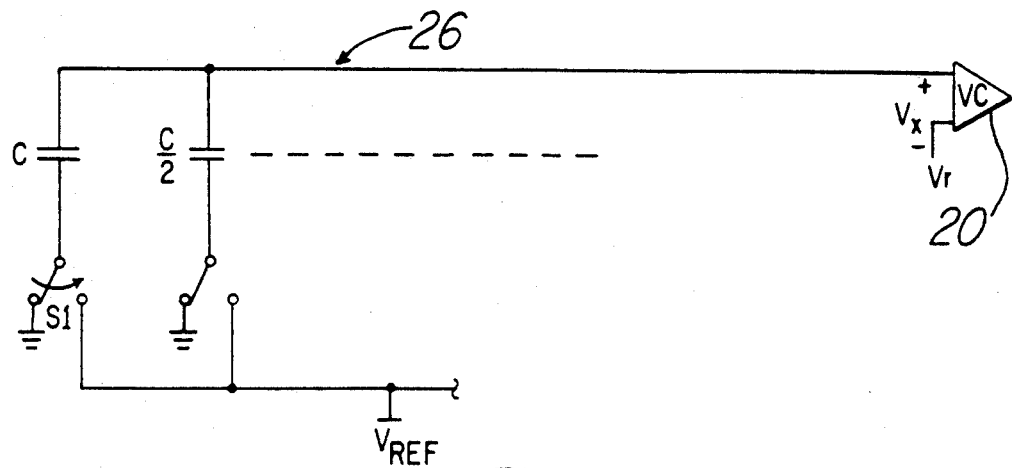
FIG. 3 is a schematic diagram of a charge-redistribution A/D converter in the re-distribution mode of operation.
Figure 4:
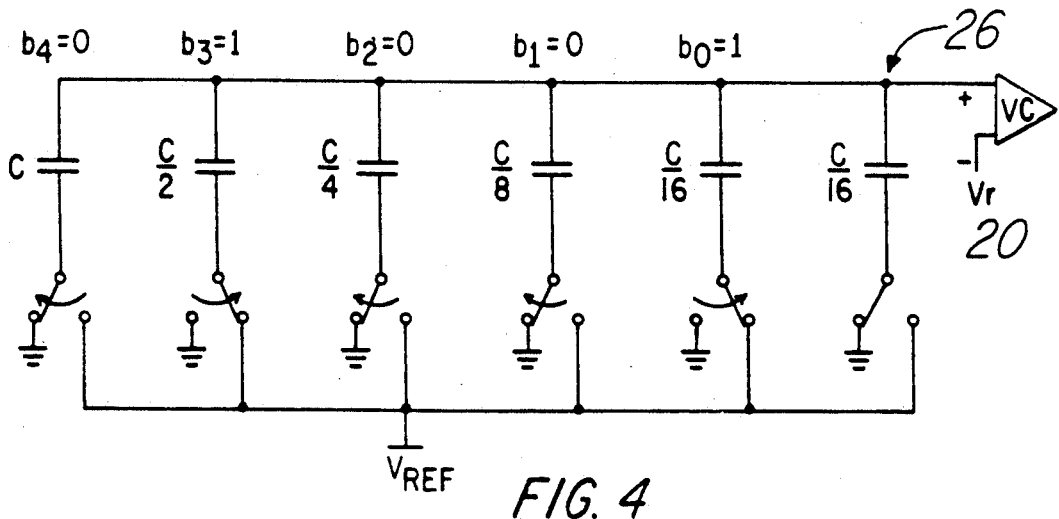
FIG. 4 is a schematic diagram of a charge-redistribution A/D converter in the converted final configuration.
Figure 5:
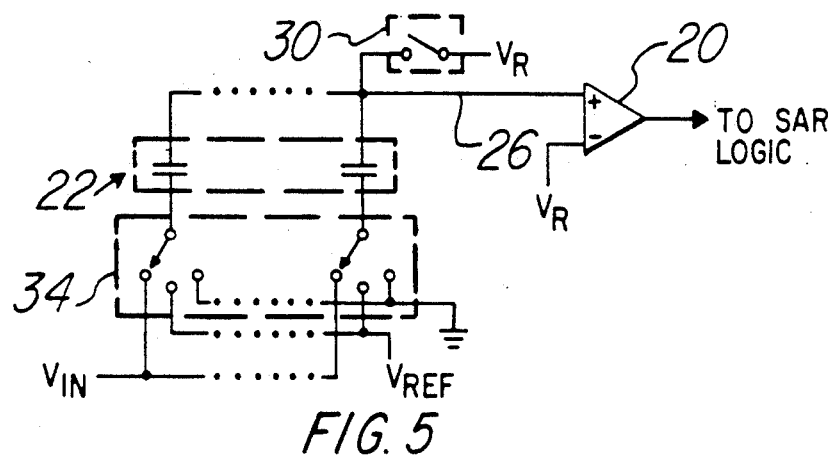
FIG. 5 is a schematic diagram of a charge-redistribution A/D converter in the sample mode of operation.

One problem associated with charge-redistribution A/D converters is degradation in performance due to dielectric relaxation phenomena which occurs in typical monolithic capacitors. For example, as shown in FIG. 5, during sampling, the bottom plate switches 34 are set to Vin, and the top plate switch 30 connects the top plate to a reset potential, Vr. During conversion, the top plate switch 30 is opened and the top plate 26 is allowed to float. The bottom plate switches 34 select between ground and Vref. The top plate potential is at Vr-Vin during the hold mode or just prior to conversion. The successive approximation register (SAR) logic controls the bottom plate switches 34 to drive the floating top plate back toward Vr. The bottom plate switches drive the floating top plate from the Vr-Vin potential to the Vr potential by providing incremental voltages in successively smaller steps as the binary weighted capacitors in the array are tested one bit at a time. The problem is that dielectric relaxation in the array capacitors 22 will drain charge on and off of the floating top plate 26 during conversion to move the capacitor charge state back towards a voltage of previous charge states. This causes a drift in the voltages away from the ideal sequences of voltages, causing conversion errors.

Figure 6:
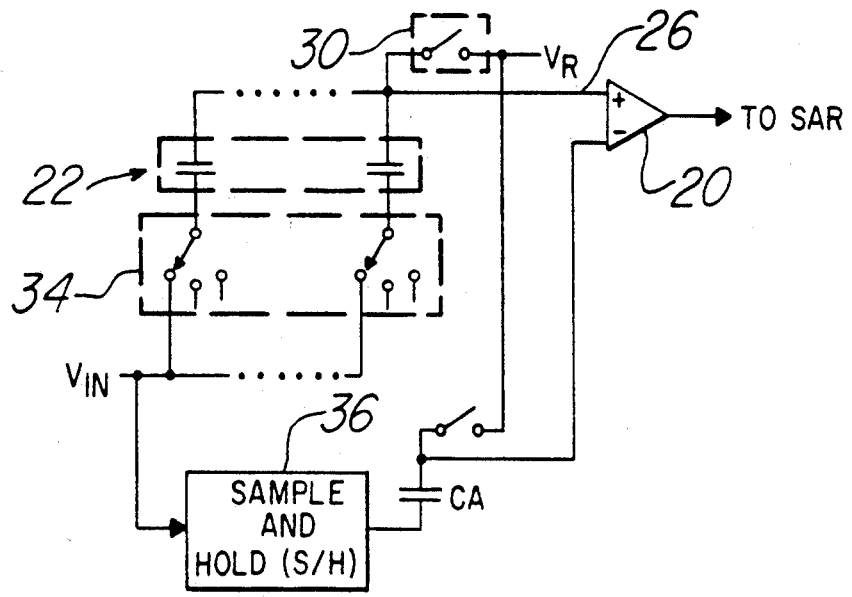
FIG. 6 is a schematic diagram of a charge-redistribution A/D converter with the dielectric relaxation correction circuit of this invention.

The inventors in the paper "The Effect of Dielectric Relaxation on Charge-Redistribution A/D Converters" published in the IEEE Journal of Solid-State Circuit, Vol. 25, No. 6, December 1990, pgs. 1550 through 1561, concluded that the error in the top plate voltage is only dependent upon the history of the previously sampled input voltages, and not on the sequence of bottom plate switching. Therefore, one correction approach is shown in FIG. 6. Ca 35 is a capacitor constructed identically to the array capacitors, and although the value of this capacitor could be the same total value to maintain circuit symmetry, the capacitance value is not critical to the operation of the correction circuit. Switch S2 opens and closes with switch 30, i.e., when the converter is sampling, the top plate of Ca 35 is charged to Vr and the same analog input signal that is sampled on all the bottom plates in the main capacitor array 22 is sampled by the sample and hold (S/H) circuit 36. The bottom plate of Ca 35 will be held at the remembered sampled input voltage by the sample and hold 36 circuit in the hold mode of operation. The sample-and-hold circuit 36 is in the sample mode when the converter is sampling and in the hold mode when the converter is converting. Therefore Ca 35 will be subject to the same sequence of charging voltages that the converter array capacitors 22 experience.

At the beginning of the conversion sequence, the top plate of Ca is allowed to float, so the inverting input of the comparator will start at Vr, but will drift as the conversion progresses by the same amount that the converter top plate 26, or the non-inverting input, will drift away from its ideal sequence. In this manner, the drift at one input will effectively cancel the drift in the other input. Therefore the operation will be equivalent to a converter with an ideal top plate sequence and a comparator threshold voltage fixed at Vr. This assumes that the operation of comparator 20 is independent of equal drift at the inverting and the non-inverting inputs i.e. has good common-mode rejection.

Figure 7:
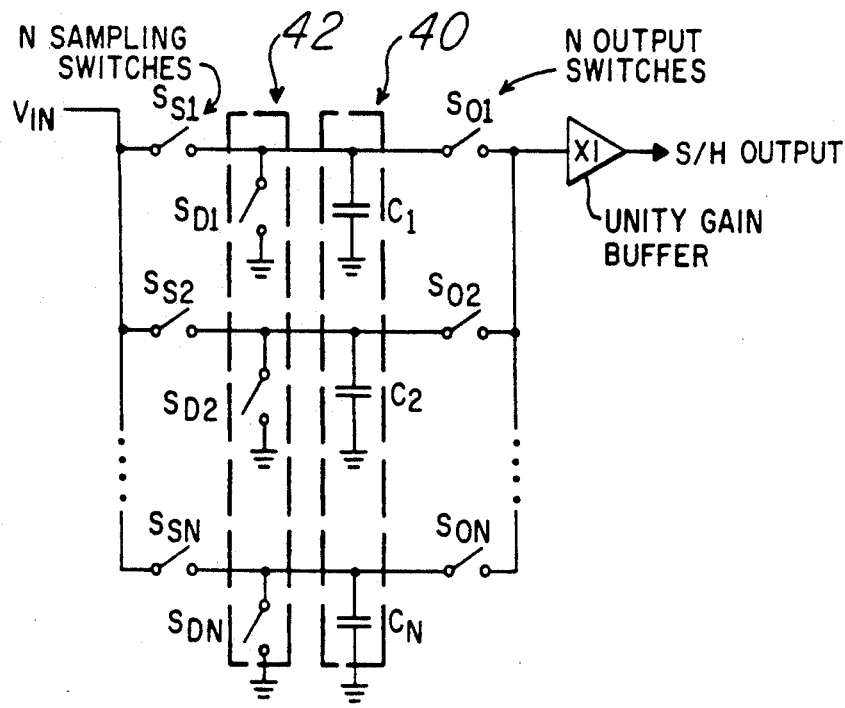
FIG. 7 is a schematic diagram of the sample and hold circuit (S/H) of FIG. 6.
Figure 8:
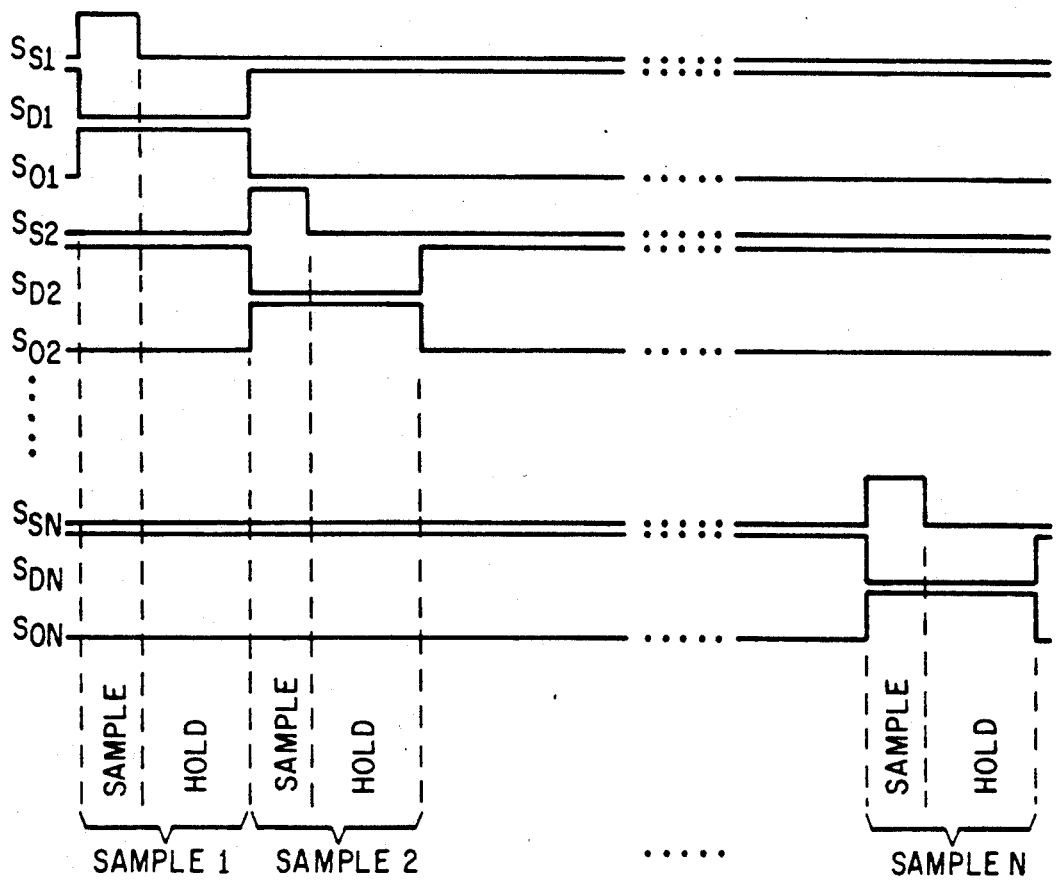
FIG. 8 is a timing diagram describing the operation of the sample and hold circuit (S/H) of FIG. 7.

The (S/H) circuit must be designed very carefully, however, to avoid effects of dielectric relaxation itself. One way to do this is shown in FIG. 7. Each sampling capacitor 40 is used every Nth sample. During the other N−1 samples, the discharging switch 42 is closed. If N is large enough, the time interval between active cycles for any given capacitor is long, and the time interval will erase the memory in the capacitor of the previous sampled voltage. It is convenient to choose N to be a power of two so that a binary counter and decoder can be used to generate the sequence of switching signals needed. This sequence then repeats. There will be some drift in the held value of the sample due to dielectric relaxation, but assuming that N is large enough such that the capacitors will be in the discharged state a large percentage of the time, this will always be back toward a memory of the discharged state. The timing diagram describing the operation of the sample and hold (S/H) circuit of FIG. 6 is shown in FIG. 7. This will cause additional drift in the comparator threshold during conversion, but this drift term will be proportional to the input voltage value, and so will be seen as only a slight gain error in the converter characteristic, and will not degrade converter linearity.

Figure 10:
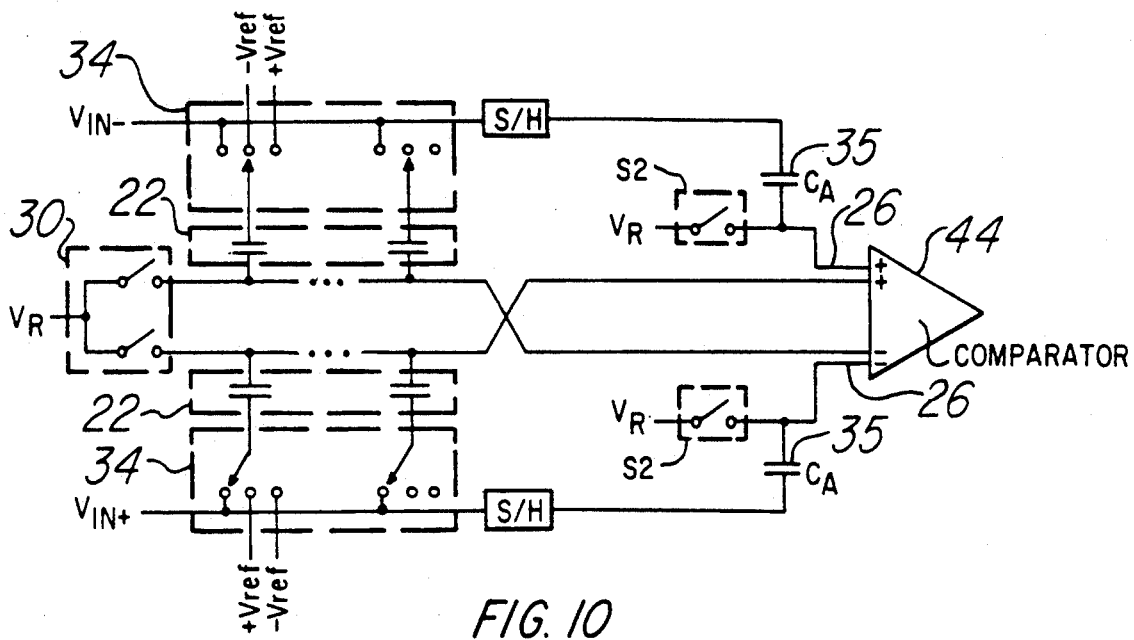
FIG. 10 is a schematic of the dielectric relaxation correction circuit of this invention applied to a differential converter circuit.

A second embodiment which applies this invention to fully-differential converters is shown in FIG. 10. The object of using a fully-differential comparator versus a single-ended comparator is the increase in precision achieved by doubling the effective input signal range. For example, in the single-ended case, the bottom plate of the capacitors in the capacitor array are charged to Vin. Then, during conversion, the bottom plate voltage switches between ground and a reference voltage Vref. If the system is based on a 5 volt supply, the input signal range is 0 to 5 volts, wherein 0 volts represents ground and 5 volts is the maximum Vin. However, in the fully-differential with dielectric relaxation correction circuit case, where there are two capacitor arrays, the bottom plate of one capacitor array samples −Vin and the bottom plate of the second capacitor array samples +Vin. Then, during conversion, the bottom plates are switched between +Vref and −Vref. Therefore, if the system voltage is again based on a 5 volt supply, the input signal range is −5 volts to +5 volts, which is a doubling of the signal range. In addition, in a differential comparator, the input signal at any point in the circuit is not represented by the voltage at a particular node but the difference in voltages between two opposite, i.e. corresponding, nodes. For example, the correction circuit for dielectric relaxation corrects for the duplicate error voltage that manifests itself as the voltage difference between the two top plates of the replica capacitances Ca 35.

In the case of a fully-differential converter that doesn't have a dielectric relaxation correction circuit, a two input comparator would be adequate where the difference in voltage is converted to some digital output. A special comparator is necessary to apply the dielectric relaxation correction circuit to a differential converter. For example, one method of implementation of the comparator in the first stage with two differential pairs in parallel is shown in FIG. 9.

Figure 9:
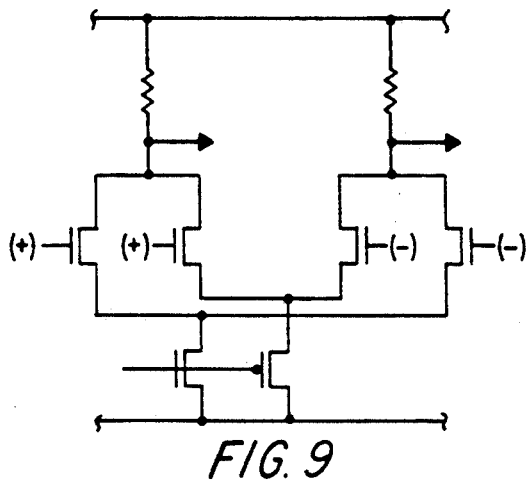
FIG. 9 is a schematic of one possible embodiment of the comparator in a differential converter circuit with dielectric relaxation correction circuitry.

As shown in FIG. 9, the comparator must have two non-inverting and two inverting inputs, wherein one pair of inverting and non-inverting inputs is offsetting inputs. Two capacitor arrays 22, two sets of switches 34 two input voltages, a positive input voltage, +Vin, and a negative input voltage, −Vin, two replica capacitances Ca and two sample and hold (S/H) circuits, comprise the necessary elements of a dielectric relaxation correction circuit applied to a differential comparator as shown in FIG. 10. Ca 35 is, like in the single-ended case, a capacitor constructed identically to the array capacitors 22, and although the value of this capacitor could be the same total value to maintain circuit symmetry, the capacitance value is not critical to the operation of the correction circuit. Switches S2 open and close with switches 30, i.e., when the converter is sampling, the top plates of Ca 35 are charged to Vr and the same analog input signal that is sampled on all the bottom plates in each main capacitor array 22 is sampled by each sample and hold circuit 36. The sample-and-hold circuits 36 are in the sample mode when the converter is sampling and in the hold mode when the converter is converting. Therefore both replica capacitances, Ca 35, will be subject to the same sequence of charging voltages that both sets of converter array capacitors 22 experience.

At the beginning of the conversion sequence, the top plates of both Cas 35 are allowed to float, so the offsetting inputs of the comparator will start at Vr, but will drift differentially as the conversion progresses by the same amount that the converter top plates 26 will drift away from its ideal sequence. In this manner, the drift at one input will effectively cancel the drift in the other input. In addition, the bottom plates of the replica capacitances Ca 35 will be held at the remembered sampled input voltage by the sample and hold 36 circuits in the hold mode of operation. Therefore, the operation will be equivalent to a converter with an ideal top plate sequence and a comparator differential threshold voltage fixed at 0.

The differential voltage between the two input terminals that makes the output transition from zero to one is no longer zero as it is in the uncorrected two input differential case, but is selected to be whatever voltage is programmed into the extra set of offsetting inputs, +Vbias and −Vbias. These offsetting inputs offset the threshold voltage of the comparator in a manner that neutralizes the drift error that occurs due to dielectric relaxation of the capacitors in the capacitor array.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A dielectric relaxation correction circuit for charge-redistribution A/D converters, operating in a sample, hold and conversion mode, comprising:
    a comparator, having an inverting input and a non-inverting input;
    a capacitor array, connected to one of said inverting and non-inverting inputs and an input voltage source which provides a sequence of charging voltages to said capacitor array, and;
    a replica capacitance, having top and bottom plates, connected to the other of said inverting and non-inverting inputs and said input voltage source which provides the same sequence of charging voltages to said replica capacitance that said capacitor array experiences and further wherein said comparator neutralizes a drift in the capacitor array voltage by receiving the same drift in said replica capacitance voltage.

2. The dielectric relaxation correction circuit of claim 1, and further comprising a sample and hold circuit (S/H) connected to the bottom plate of said replica capacitance.

3. The dielectric relaxation correction circuit of claim 2, wherein said sample and hold circuit (S/H) is operable to sample an input signal voltage during said sample mode and to hold the bottom plate of said replica capacitance at said input signal voltage during said conversion mode of converter operation.

4. The dielectric relaxation correction circuit of claim 2, wherein said sample and hold circuit receives an input signal voltage simultaneously with said capacitor array.

5. The dielectric relaxation correction circuit of claim 1, wherein the top plate of said replica capacitance is connected to the inverting input of said comparator.

6. The dielectric relaxation correction circuit of claim 1, wherein the top plate of said capacitor array is connected to the non-inverting input of said comparator.

7. The dielectric relaxation correction circuit of claim 2, wherein said sample and hold circuit (S/H) comprises an array of sampling capacitances and an array of discharging switches connected to said array of sampling capacitances for discharging said sampling capacitances.

8. The dielectric relaxation correction circuit of claim 7, wherein each sampling capacitance in said sample and hold circuit (S/H) is used every Nth sample, where N is a positive integer, and further wherein N is chosen to allow said sampling capacitances to discharge adequately before sampling another input signal voltage.

9. The dielectric relaxation correction circuit of claim 8, wherein said array of discharge switches comprise N discharge switches and one switch at a time is open every Nth sample.

10. A dielectric relaxation correction circuit for fully differential charge-redistribution A/D converters, operating in a sample, hold and conversion mode, comprising:
    a comparator comprising a first non-inverting input and a first inverting input, in addition to at least one pair of offsetting inputs;

a first and a second capacitor array, each having top and bottom plates, and each connected to an input voltage source which provides a sequence of charging voltages to said capacitor arrays, and;

a first and a second replica capacitance, each having top and bottom plates, and connected to said input voltage source which provides the same sequence of charging voltages to said first and second replica capacitances that said first and second capacitance arrays experience and further wherein said comparator neutralizes a drift in the first and second capacitor array voltage by receiving the same drift in said first and second replica capacitance.

11. The dielectric relaxation correction circuit of claim 10, and further comprising a sample and hold circuit (S/H) connected to the bottom plate of said first replica capacitance and a sample and hold circuit (S/H) connected to the bottom plate of said second replica capacitance.

12. The dielectric relaxation correction circuit of claim 11, wherein said sample and hold circuit (S/H) is operable to sample an input signal voltage during said sample mode and to hold said bottom plate of said replica capacitance at said input signal voltage during said conversion mode of converter operation.

13. The dielectric relaxation correction circuit of claim 11, wherein said sample and hold circuits receive input signal voltages simultaneously with said first and second capacitor arrays.

14. The dielectric relaxation correction circuit of claim 10, wherein said pair of offsetting inputs comprises a second inverting input and a second non-inverting input.

15. The dielectric relaxation correction circuit of claim 10, wherein the top plates of said first and second capacitor arrays are connected to said first non-inverting and inverting inputs of said comparator.

16. The dielectric relaxation correction circuit of claim 11, wherein said sample and hold circuit (S/H) comprises an array of N sampling capacitances, where N is a positive integer, and an array of discharge switches connected to said array of sampling capacitances for discharging said sampling capacitances.

17. The dielectric relaxation correction circuit of claim 16, wherein each sampling capacitance is used every Nth sample, where N is a positive integer, and further wherein N is chosen to allow said sampling capacitances to discharge adequately before sampling another input signal voltage.

18. The dielectric relaxation correction circuit of claim 16, wherein said array of discharge switches comprises N discharge switches, where N is a positive integer, and wherein further one of said N discharge switches is open every Nth sample and closed for the other N−1 samples.

* * * * *